US011220843B2

(12) United States Patent
Harkonen et al.

(10) Patent No.: US 11,220,843 B2
(45) Date of Patent: Jan. 11, 2022

(54) ELECTRONIC LOCK ASSEMBLY

(71) Applicant: Abloy Oy, Joensuu (FI)

(72) Inventors: Taneli Harkonen, Joensuu (FI); Mika Purmonen, Joensuu (FI); Markku Makkonen, Kontiolahti (FI); Esko Strommer, Oulu (FI)

(73) Assignee: ABLOY OY, Joensuu (FI)

( * ) Notice: Subject to any disclaimer, the term of this patent is extended or adjusted under 35 U.S.C. 154(b) by 757 days.

(21) Appl. No.: 15/987,592

(22) Filed: May 23, 2018

(65) Prior Publication Data
US 2018/0340351 A1   Nov. 29, 2018

(30) Foreign Application Priority Data

May 23, 2017   (FI) ...................................... 20175461

(51) Int. Cl.
*E05B 47/00*   (2006.01)
*G07C 9/00*   (2020.01)
(Continued)

(52) U.S. Cl.
CPC .......... *E05B 47/0001* (2013.01); *E05B 17/10* (2013.01); *G01R 27/2605* (2013.01);
(Continued)

(58) Field of Classification Search
CPC ....... E05B 47/0002; E05B 2047/00634; E05B 2047/0087; E05B 2047/0097; E05B 17/10; E05B 47/00; E05B 47/0001; E05B 47/0003; E05B 47/0004; E05B 47/0005; E05B 47/0006; E05B 47/0009; E05B 47/0011; E05B 47/0012; E05B 47/0038; E05B 47/0042; E05B 47/06; E05B 47/0603; E05B 47/0607; E05B 2047/0007; E05B 2047/0008; E05B 2047/0013; E05B 2047/0048; E05B 2047/0057; E05B 2047/0058; E05B 2047/0059; E05B 2047/0061; E05B 2047/0062;
(Continued)

(56) References Cited

U.S. PATENT DOCUMENTS 4,967,305 A * 10/1990 Murrer .................. E05B 47/068
340/5.54
6,005,487 A * 12/1999 Hyatt, Jr. .............. H04L 9/3226
340/5.65
(Continued)

FOREIGN PATENT DOCUMENTS

CN   203662263 U   6/2014
EP   2016243 A1   1/2009
(Continued)

*Primary Examiner* — Kristina R Fulton
*Assistant Examiner* — Steven A Tullia
(74) *Attorney, Agent, or Firm* — Muncy, Geissler, Olds and Lowe, P.C.

(57) ABSTRACT

An electronic lock assembly according to the invention includes a capacitor unit for storing secondary power, a test circuit for testing the capacitor unit. The test circuit is arranged to connect a test load to the capacitor unit for testing its condition, and to measure the voltage of the capacitor unit before connecting the test load, slightly after connecting the test load, and slightly before disconnecting the test load.

19 Claims, 3 Drawing Sheets

(51) Int. Cl.
   *G01R 31/64* (2020.01)
   *E05B 17/10* (2006.01)
   *G01R 27/26* (2006.01)
   *H02J 7/00* (2006.01)
   *H02J 7/34* (2006.01)

(52) U.S. Cl.
   CPC ......... *G01R 31/64* (2020.01); *G07C 9/00174* (2013.01); *G07C 9/00944* (2013.01); *H02J 7/0068* (2013.01); *E05B 2047/0087* (2013.01); *E05B 2047/0097* (2013.01); *G07C 2009/00634* (2013.01); *G07C 2009/00642* (2013.01); *H02J 7/345* (2013.01)

(58) Field of Classification Search
   CPC ..... E05B 2047/0065; E05B 2047/0066; E05B 2047/0082; E05B 2047/0089; E05B 2063/0094; E05B 65/0017; E05B 65/0032; H02J 7/345; H02J 7/0068; G07C 2009/00634; G07C 2009/00642; G07C 9/00174; C07C 9/00644; G01R 31/64; G01R 27/2605; Y10T 292/1021; Y10T 292/1082
   USPC .......................................................... 70/224
   See application file for complete search history.

(56) References Cited

U.S. PATENT DOCUMENTS

| | | | | |
|---|---|---|---|---|
| 6,880,967 | B2* | 4/2005 | Isozumi | G01R 31/003 374/102 |
| 7,487,391 | B2* | 2/2009 | Pecone | G06F 1/28 714/14 |
| 8,065,562 | B2* | 11/2011 | Wilson | G06F 1/30 714/22 |
| 8,154,259 | B2* | 4/2012 | Sartore | G11C 16/30 320/167 |
| 8,607,076 | B2* | 12/2013 | Lester | G06F 1/30 713/300 |
| 2009/0178449 | A1* | 7/2009 | Raatikainen | E05B 47/026 70/263 |
| 2015/0171664 | A1 | 6/2015 | Liu et al. | |
| 2015/0240529 | A1* | 8/2015 | Dore Vasudevan | E05B 17/0091 70/277 |
| 2015/0268709 | A1* | 9/2015 | Morning-Smith | G01R 31/64 307/23 |
| 2015/0330116 | A1* | 11/2015 | Dente | E05B 77/12 307/10.1 |

FOREIGN PATENT DOCUMENTS

| | | |
|---|---|---|
| WO | WO2007/125163 A1 | 11/2007 |
| WO | WO2013/107497 A1 | 7/2013 |
| WO | WO2015/183250 A1 | 12/2015 |
| WO | WO-2015183250 A1 * | 12/2015 ............ G01R 31/64 |

* cited by examiner

ELECTRONIC LOCK ASSEMBLY

BACKGROUND OF THE INVENTION

Field of the Invention

The invention relates to an electronic lock assembly supplied from an external power source. The external power source supplies the actuator or actuators of the electronic lock assembly with the energy needed for driving the electronic lock assembly from a locked state to an unlocked state, and vice versa.

BRIEF SUMMARY OF THE RELATED ART

It is well known to apply an external power source for supplying electric energy to an electronic lock assembly, to provide the electric actuator or actuators with the energy needed. The electric actuator is, for example, a solenoid or an electric motor connected to a dead lock mechanism. The dead lock mechanism may be driven from the locked state to the unlocked state and vice versa by the electric actuator or electric actuators. The unlocked state refers to the state in which the latch of the electronic lock mechanism can withdraw into the lock body without being prevented by the dead lock mechanism. The locked state means that the dead lock mechanism prevents the withdrawal of the latch into the lock body, whereby the part of the latch protruding from the lock body locks, for example, a door in which the lock body is installed, against the jamb of the door.

Furthermore, the electronic lock assembly may comprise a handle state in which the locked state can be switched to the unlocked state by applying a handle. Thus, applying the handle connected to the lock body will unlock the lock from the locked state to the unlocked state. The electric actuator or a second electric actuator is arranged to set the electronic lock assembly on or off the handle state.

The electronic lock assembly thus comprises an input connection receiving power from an external power source and supplying it to an electric actuator or electric actuators. In the event of a failure in the power source or the power transmission connection between the electronic lock assembly and the power source, during which no electric power can be supplied to the electronic lock assembly, this failure can be detected at the connection of the external power source. For such situations, the electronic lock assembly may also comprise a secondary power supply circuit connected to the input connection and comprising a capacitor unit for storing reserve power. Electric energy stored by the capacitor unit of the secondary power supply circuit may be used in the electronic lock assembly when no electric energy is supplied by the external power source.

The charging capacity of the capacitor unit may be reduced upon ageing. Although capacitors have a relatively long service life, their charging capacity may be reduced over time to such an extent that they can no longer function properly. Consequently, an old capacitor unit in the electronic lock assembly may no longer be capable of charging a sufficient amount of electric energy to meet the power demand of the electric actuator during a failure of the external power source. This may cause danger situations in safety when the electronic lock assembly cannot be driven to the locked state or the unlocked state. The user of the electronic lock assembly should inspect the condition of the capacitor unit manually every now and then. This is not always observed, whereby it is first in the event of a failure that lock maintenance is called in.

SUMMARY OF THE INVENTION

The aim of the invention is to provide an electronic lock assembly in which the condition of the capacitor unit is monitored by the electronic lock assembly itself. Thus, no particular monitoring measures need to be taken by the user of the electronic lock assembly. Possible danger situations in safety can be foreseen, whereby it is possible to avoid them or at least to minimize their effect. This is achieved in the way presented in the independent claim. The dependent claims describe various embodiments of the invention.

The electronic lock assembly according to the invention comprises a latch 1, a dead lock mechanism 2 for the latch, and an electric actuator 3 for unlocking and locking the electronic lock assembly. The dead lock mechanism 2 is connected to the latch 1, and the electric actuator 3 is connected to the dead lock mechanism for controlling it from the locked state to the unlocked state and vice versa. The electronic lock assembly also comprises a connection 4 receiving power from an external power source, the connection being connected to an electric actuator 3 and a secondary power supply circuit 5. The secondary power supply circuit comprises a capacitor unit 6 for storing reserve capacity.

The electronic lock assembly also comprises a test circuit 7 for testing the capacitor unit 6. The test circuit 7 is arranged to connect a test load 8 to the capacitor unit 6 for testing its condition, and to measure the voltage of the capacitor unit 6 before connecting the test load 8, slightly after connecting the test load, and slightly before disconnecting the test load.

The electronic lock assembly further comprises a control unit 9 arranged to control the test circuit 7, to calculate the ESR (equivalent serial resistance) value and the capacitance value of the capacitor unit 6 on the basis of said measurements, and to determine the condition of the capacitor unit on the basis of these values.

BRIEF DESCRIPTION OF THE DRAWINGS

In the following, the invention will be described in more detail with reference to the appended figures, in which.

DETAILED DESCRIPTION OF THE PREFERRED EMBODIMENTS

Figure 1:
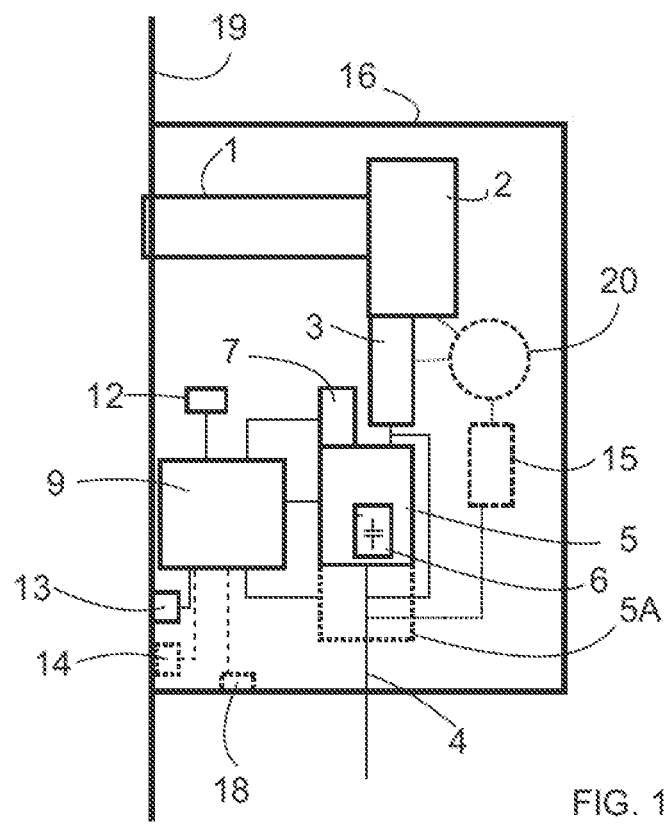
FIG. 1 shows an example of an electronic lock assembly according to the invention.

FIG. 1 shows an example of an electronic lock assembly according to the invention. The electronic lock assembly comprises a latch 1, a dead lock mechanism 2 for the latch, and an electric actuator 3 for unlocking and locking the electronic lock assembly. The electric actuator 3 is a solenoid or an electric motor. The dead lock mechanism 2 is connected to the latch 1, and the electric actuator 3 is connected to the dead lock mechanism for driving it from the locked state to the unlocked state and vice versa. The electric actuator may be connected to the dead lock mechanism directly or by means of a part/parts, for controlling it.

The electronic lock assembly also comprises a connection 4 receiving power from an external power source and supplying it to an electric actuator 3. The electronic lock assembly also comprises a secondary power supply circuit 5 which is also connected to the connection 4 and comprises a capacitor unit 6 for storing reserve capacity. The secondary power supply circuit is connected to supply electric energy to the actuator 3 when there is a failure in the external power source or its power transmission connection, preventing the transmission of electric power to the connection 4. The connection may be a cable connection or a wireless connection (such as an induction connection) used for the transmission of electric power.

The electronic lock assembly comprises a test circuit 7 for testing the capacitor unit 6. The test circuit 7 is arranged to connect a test load 8 (FIG. 5) to the capacitor unit 6 for testing its condition, and to measure the voltage of the capacitor unit 6 before connecting the test load 8, a second time after connecting the test load, and a third time before disconnecting the test load and after the second time. The electronic lock assembly also comprises a control unit 9 arranged to control the test circuit 7, to calculate the ESR value and the capacitance value of the capacitor unit 6 on the basis of said measurements, and to determine the condition of the capacitor unit on the basis of these values.

Figure 2:
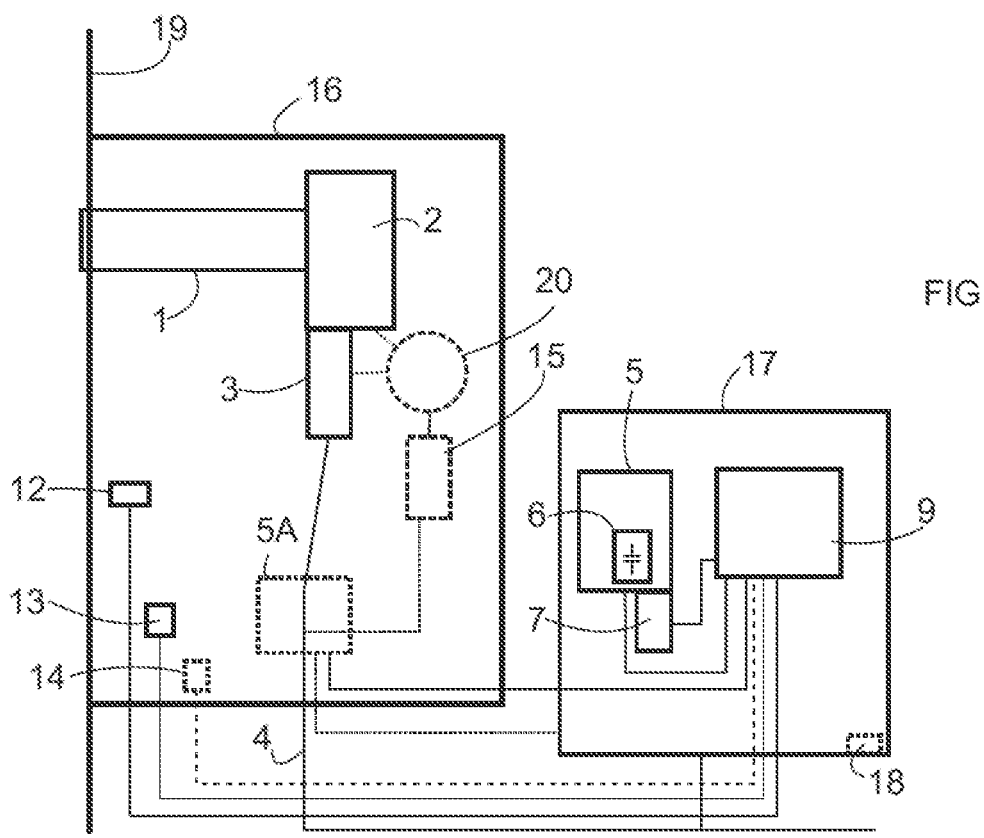
FIG. 2 shows another example of an electronic lock assembly according to the invention.

FIG. 2 shows an example of another embodiment of the electronic lock assembly. In this embodiment, the electronic lock assembly comprises a separate control module 17 in addition to the lock body 16, as in the embodiment of FIG. 1. After all the components mentioned above, and also other components yet unmentioned, have been accommodated in the lock body of the embodiment of FIG. 1, the separate control module 17 makes it possible to place components in it as well. In the example of FIG. 2, the control module comprises a control unit 9, a secondary power supply circuit 5, and a data transmission unit 18 which will be described in more detail later on. Naturally, it is also possible to distribute components between the control module and the lock body in another way as well. For example, the control unit and the capacitor unit 6 may be placed in the control module, in which case the other components of the secondary power supply circuit are placed in the lock body 16. It is also possible to place the control unit 9 alone in the control module. For example, the control unit and/or the capacitor unit in the control module can be electrically connected to the lock body, that is, to the components placed in it and using the control unit and/or the capacitor unit.

FIGS. 1 and 2 show that the lock body comprises a front shield 19 with a slot for the latch 1. The lock body may also be equipped with a handle connection 20, wherein the latch 1 can be moved into the lock body by applying a handle connected thereto. The electronic lock assembly equipped with a handle connection may also be arranged to comprise a handle state in which the locked state of the electronic lock assembly can be switched to the unlocked state by applying the handle (i.e. by turning the handle). In an electronic lock assembly comprising a handle state, the electric actuator 3 or another electric actuator 15 is arranged to set the electronic lock assembly on or off the handle state.

FIGS. 1 and 2 further show that the electronic lock assembly may also be equipped with an audio signal device 13, a light signal device 14, or a data transmission unit 18 connected to the control unit 9 and arranged to inform the user of the electronic lock assembly about the condition of the capacitor unit 6, if the capacitor unit is defective. It is cost efficient to use only one device to inform the user, but the use of more devices is possible as well. The audio signal device may be, for example, a buzzer or another audio device. The light signal device may be, for example, a LED or another light source. The communication unit may transfer the information about the condition of the capacitor unit to e.g. a control center for monitoring all the electronic lock assemblies of a real estate and their condition. Further, FIGS. 1 and 2 show that the electronic lock assembly may also comprise a coupling circuit 5A which may be integrated in the secondary power supply circuit 5, or it is a separate circuit connected to the secondary power supply circuit. The coupling circuit supplies electric power from the connection 4 to the secondary power supply circuit 5 and to the actuator/actuators. It is convenient that the control unit is also supplied with electric energy from the connection 4, although this is not presented in the drawings. The control unit, as well as the other electric devices of the electronic lock assembly, may be arranged to be supplied with electric energy from the capacitor unit during a failure. The figures accompanying this description are simplified example representations, wherein the actual embodiments to be implemented in addition to the components shown in them may also comprise other components which are, however, not essential for the implementation of the invention. Thus, on the basis of this description, a person skilled in the art can manufacture an electronic lock assembly according to the invention.

As can be seen from FIG. 2, the electric power supply can be arranged directly to both the lock body 16 and the control module 17, depending on how the components of the electronic lock assembly are distributed between the lock body and the control module. The electric power transmission may be implemented in another way as well, for example so that electric power is supplied from the external power source merely to the control module 17, from which electric energy is transmitted further to the lock body 16. The control module 17 and simultaneously the components included in it, such as the control unit 9, may thus be connected to the lock body 17 and the external power source in various ways.

The electric lock assembly may also comprise a temperature sensor 12 whose operation will be described in more detail later on.

Figure 3:
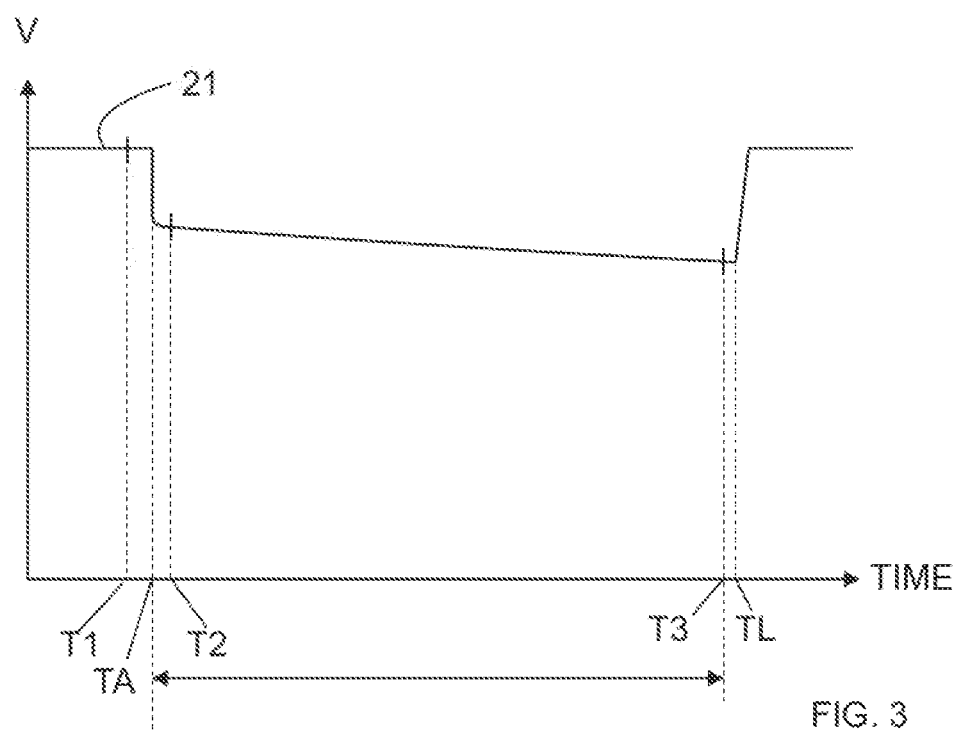
FIG. 3 shows an example of a voltage curve of the capacitor unit and of a measurement according to the invention.
Figure 4:
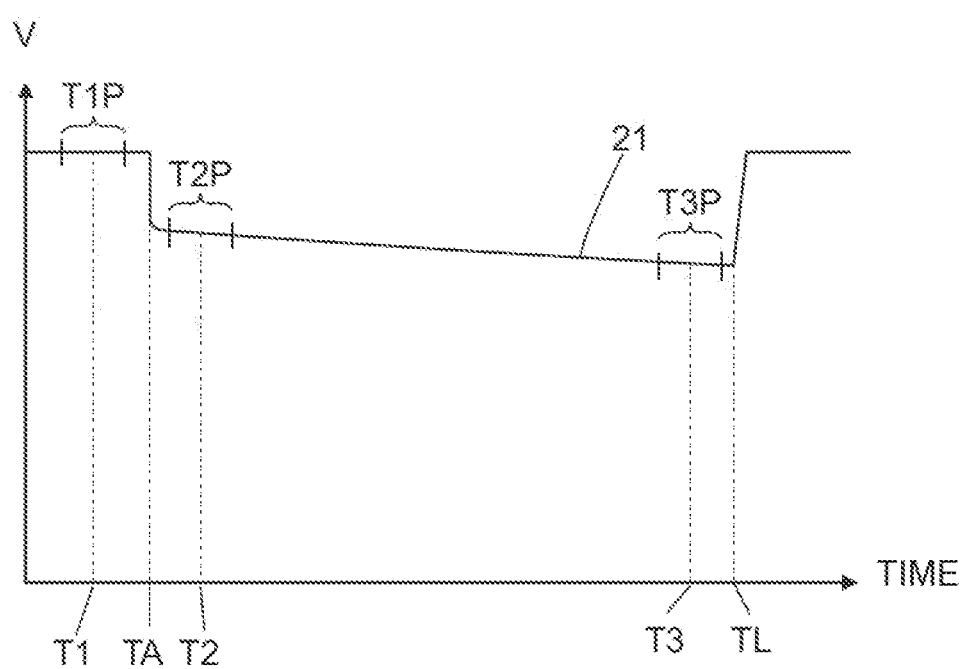
FIG. 4 shows another example of a voltage curve of the capacitor unit and of a measurement according to the invention.

FIGS. 3 and 4 exemplify voltage curves 21 of the capacitor unit 6 during testing, and measurements according to the invention. Before the actual testing period 10, the voltage of the capacitor unit 6 is measured, in the example of FIG. 3 at a moment of time T1. The testing period begins when a test load 8 (FIG. 5) is connected to the capacitor unit at a moment of time TA. The testing period ends when the test load is disconnected from the capacitor unit at a moment of time TL. When the test load is connected at the moment of time TA, the voltage drops because a current passes through the test load. Let us assume that the current is constant, whereby the voltage change is $$\Delta V_1 = R_{ESR} I \quad (1)$$

where $\Delta V_1$ is the voltage drop at the moment of time TA, $R_{ESR}$ is the ESR value of the capacitor unit, and I is the current passing through it.

The voltage $V_{T4}$ having the lower value at the moment of time TA can be estimated by interpolation by using the values for other times of measurement and the time difference between the measurements. The voltage is measured for a second time slightly after connecting the test load at a moment of time T2, whereby a value $V_{T2}$ is obtained. The voltage is also measured for a third time at a moment of time T3 slightly before disconnecting the test load at the moment of time TL, whereby a measurement value $V_{T3}$ is obtained. Between the measurement times T2 and T3, the voltage curve has descended sufficiently to show a clear difference between the measurement values for the moments of time T2 and T3, which improves the accuracy of the testing. The measurements provide an angular coefficient $$k=(V_{T2}-V_{T3})/(T3-T2) \quad (2)$$

which is applied to give $$V_{T4}=V_{T2}+k(T2-TA) \quad (3)$$

Let us assume that the current I remains constant during the whole measurement, and it passes through the test load. When the formula 1 is applied as a formula for the voltage of the test load as well, the value $R_{ESR}$ can be derived from the formula $$R_{ESR}=R_L(V_{T1}-V_{T4})/V_{T4} \quad (4)$$

where $R_L$ is the test load 8, i.e. the load resistance.

By applying the angular coefficient k, the capacitance is obtained from the formula $$C=(V_{T2}+V_{T3})/2k(R_{ESR}+R_L) \quad (5)$$

As can be seen, the ESR value and the capacitance value for the capacitor unit can be determined by three voltage measurements. The measurement can be made accurate by applying, for example, the method shown in FIG. 4.

The measurement of the voltage of the capacitor unit 6 before connecting the test load 8, a second time slightly after connecting the test load, and a third time slightly before disconnecting the test load, can be arranged to be taken at predetermined measurement time intervals T1P, T2P, T3P so that several voltage measurements are taken during each measurement time interval. The control unit 9 is arranged to calculate an average voltage from the voltage measurements of the measurement time interval, to be used as the measurement value for each measurement time interval T1P, T2P, T3P. In such a method, the average time of the measurement time interval may be regarded as the time of measurement. Thus, in the method according to FIG. 4, it is possible to reduce the effect of an error, such as measurement noise, in a single measurement.

The measurement time interval may be, for example, 50 to 150 ms, and the number of measurements within the measurement time interval may range, for example, from 10 to 150. The second measurement after connecting the test load 8 may be arranged to be taken within 5 to 400 ms after connecting the test load, and said third measurement before disconnecting the test load 8 may be arranged to be taken within 5 to 300 ms before disconnecting the test load. The control unit 9 is arranged to apply a predetermined testing period 10 for the test circuit 7. The predetermined testing period may be, for example, about 1 second. When the testing period is sufficiently long, the voltage is reduced sufficiently to provide a more reliable calculation of the angular coefficient k. The testing period is predetermined, as are the measurement times T1, T2 and T3.

Because the actuator/actuators of the electronic lock assembly affect the size and the charging capacity required of the capacitor unit in order to supply sufficient electric energy in the event of a failure, the capacitance value of the capacitor unit is specific to the electronic lock assembly in question. As there is a corresponding number of electronic lock assemblies, the value of the capacitor unit may thus vary to a great extent between the different electronic lock assemblies.

Consequently, the capacitor unit and thereby also the load resistance influence the testing period as well, which is thus also specific to the electronic lock assembly in question. The testing period varies from 0.8 to 10 s in different electronic lock assemblies. In an electronic lock assembly designed for a special purpose, the testing period may also be outside this time range.

Thus, the testing period is such that a sufficient time is left between the abovementioned second and third measurements, to achieve accuracy for calculating the capacitance on the basis of the measurements, and on the other hand, the testing period should be maintained short so that a sufficient charge would remain in the capacitor unit after the testing period.

The control unit 9 is thus arranged to control the test circuit 7, to calculate the ESR value and the capacitance value of the capacitor unit 6 on the basis of said measurements, and to determine the condition of the capacitor unit on the basis of these values. The control unit 9 is also arranged to control the test circuit 7 at certain intervals in order to test the condition of the capacitor unit 6. The interval between the tests may be, for example, 11 to 14 hours.

The testing and the test circuit 7 are designed so that a sufficient reserve capacity is left in the capacitor unit 6 after disconnecting the test load 8.

Moreover, the control unit 9 is arranged to stop the testing of the capacitor unit 6 if a fault is detected in the connection 4 to the external power source during the testing period 10. In other words, the capacitor unit may supply reserve power to the electric actuator outside the testing period and, if necessary, during a predetermined testing period when the test is interrupted.

Figure 5:
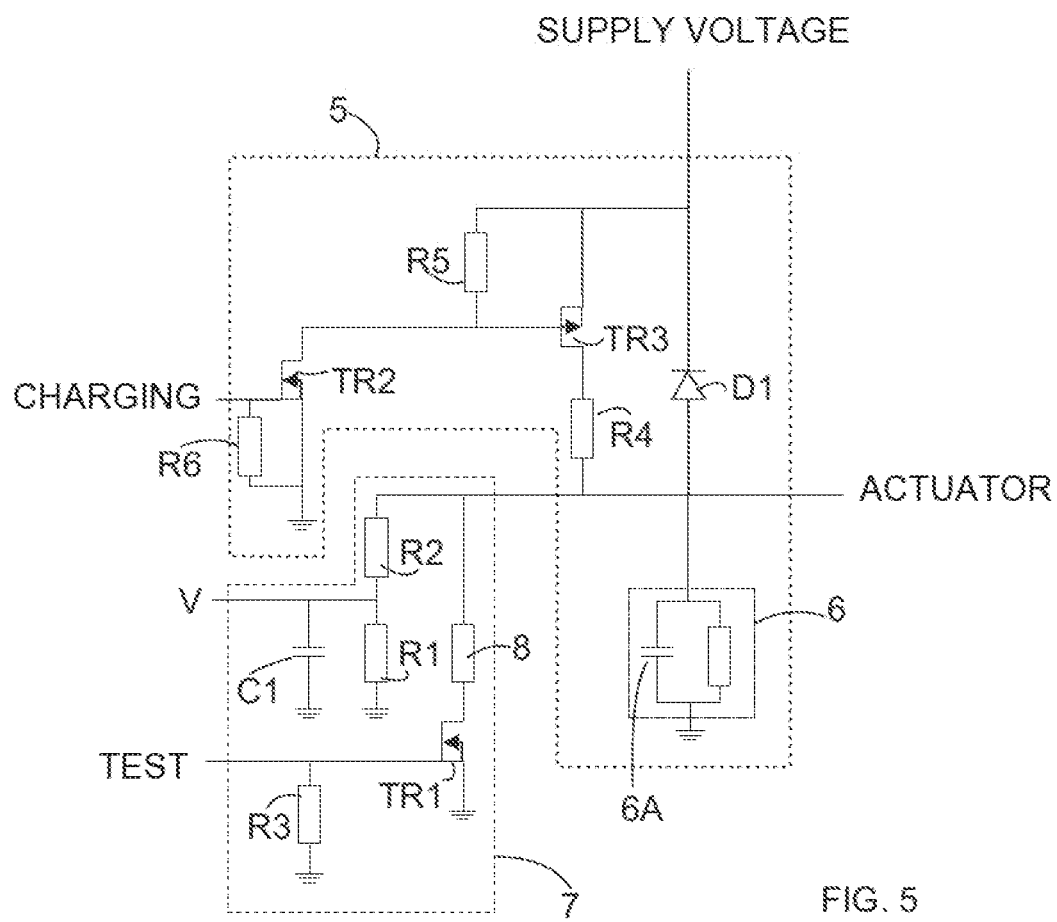
FIG. 5 shows an example of a circuit chart on testing of a capacitor unit according to the invention.
Figure 6:
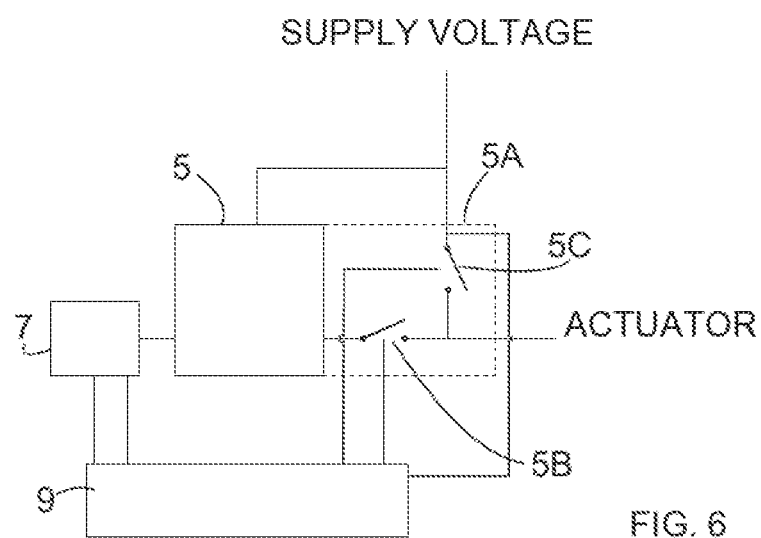
FIG. 6 shows another example of circuit chart on testing of a capacitor unit according to the invention.

FIGS. 5 and 6 show example circuit diagrams of a test circuit 7 and a secondary power supply circuit 5. When the capacitor unit 6 is not being tested, the secondary power supply circuit may charge the capacitor unit to keep its charge at the maximum. The control unit 9 may monitor the secondary power supply circuit 5. When the capacitor unit is fully charged/loaded, it does not need to be charged, and the charging may be interrupted. The charging is interrupted for the time of testing. When charging is interrupted in the embodiment according to the example of FIG. 5, a transistor TR2 is switched to a conducting state by the control CHARGING which is set to a suitable value by a resistor R6. The conducting state of the transistor TR2 changes the control of a transistor TR3 via a resistor R5, whereby the transistor TR3 will not conduct, and the charging current will not pass through a resistor R4. A diode D1 prevents a direct connection of the charging current to the capacitor unit.

When the capacitor unit is being tested, its charging is prevented. The test load 8 is connected to the capacitor unit 6 by supplying the transistor TR1 with a control voltage TESTI set to a suitable value by the resistance R3, whereby the transistor TR1 is switched to a conductive state, and the current can pass through the load resistance. The voltage measurement V of the capacitor unit is set to a suitable level by the resistors R1 and R2 and filtered by the capacitor C1. It should be noted that the capacitor unit 6 may comprise one or more capacitors 6A. If several capacitors are provided, they are connected in series and/or in parallel. The capacitor or capacitors may also be so-called supercapacitors.

FIG. 6 illustrates the connections of the test circuit 7 and the secondary power supply circuit 5 to the other components, such as the control unit 9. As described above, the coupling circuit 5A may be integrated in the secondary power supply circuit 5, or it is a separate circuit connected to the secondary power supply circuit. FIG. 6 illustrates the operation of the coupling circuit by switches 5B and 5C. When the switch 5C is closed and the switch 5B is open, the actuator 3 is powered by an external power source (supply voltage marked in FIGS. 5 and 6). When the switch 5C is open and the switch 5B is closed, the actuator is powered by the secondary power supply circuit 5. The representation of FIG. 6 is a reduced circuit diagram, wherein it is obvious that the structure of the coupling circuit 5A may be different from the structure shown in FIG. 6.

The electronic lock assembly comprises an ESR limit value and a capacitance limit value. The control unit 9 is arranged to compare the measured ESR value and capacitance value to the respective limit values and, in response to the comparison, to determine the condition of the capacitor unit 6. In the simplest form, the limit values may thus comprise one ESR value and one capacitance value, for example 800 ms) for the ESR limit value and 350 mF for the capacitance. To enhance the accuracy, however, it is possible to comprise ESR limit values and capacitance limit values for different temperatures. The ESR and capacitance limit values to be used are thus higher when the temperature decreases. Correspondingly, the limit values to be used are lower when the temperature increases. The limit values can be presented as values in a table, wherein the electronic lock assembly thus comprises a table of limit values. To make use of the limit values for the different temperatures, the electronic lock assembly may comprise a temperature sensor 12 for measuring the temperature. The temperature sensor is connected to the control unit 9. Because the table does not necessarily comprise said values for each different temperature but for some temperatures only, the control unit may be arranged to interpolate the ESR limit value and the capacitance limit value for the measured temperature by applying the values in the limit value table if the measured temperature is not included in the limit value table.

If the measured ESR value is higher than the ESR limit value, the control unit may determine, on the basis of one comparison, that the capacitor unit is defective. Correspondingly, if the measured capacitance value is lower than the limit value for the capacitance, the control unit may determine on the basis of one comparison that the capacitor unit is defective. However, it is safer that the control unit 9 is arranged to apply several measurements for determining a change in the condition of the capacitor unit 6 from a functional capacitor unit to a defective capacitor unit. For example, if six comparisons in succession indicate that the capacitor unit is defective, it is first then that the capacitor unit is determined to be defective. For indicating a defect, it is sufficient that either one of the measured ESR value and the capacitance value indicates, on the basis of the comparison, that the ESR value is too high or the capacitance value is too low. After the capacitor unit has been determined to be defective, the user may be informed of this by an audio signal device 13, a light signal device 14, or a data transmission unit 18.

The ESR and capacitance limit values relate to the actuator used in the electronic lock assembly, that is, for example, the power and capacity of a solenoid or an electric motor. The way of implementation, the structure, and the dimensioning of the test circuit are factors influencing the limit values. In other words, the limit values depend on the implementation of the electronic lock assembly.

It is convenient to implement the control unit to comprise a processor and a memory. The above mentioned limit values may be provided in the form of, for example, a limit value table in the memory. Furthermore, the control unit may be arranged to be capable of executing the necessary control commands to provide the actuator/actuators and possibly other components with electric energy in the event of a failure in the external power supply, at least at the beginning of the failure, of shifting the electronic lock assembly to a desired state.

The invention provides a relatively simple, robust and reliable way of measuring the condition of the capacitor unit of the electronic lock assembly without user action. Because the electronic lock assembly monitors the condition of the capacitor unit 6 by itself, the maintenance of the electronic lock assembly is easier. Consequently, the reliability and safety of the electronic lock assembly are improved, because its functionality and being in order are more secure.

The electronic lock assembly according to the invention can be implemented by various embodiments. Consequently, the invention is not limited to the examples presented in this description, but it may be implemented in various ways within the scope of the independent claim.

What is claimed:

1. An electronic lock assembly comprising:
   a latch;
   a dead lock mechanism of the latch;
   an electric actuator to unlock and to lock the electronic lock assembly, the dead lock mechanism being connected to the latch, and the electric actuator being connected to the dead lock mechanism to drive it from the locked state to the unlocked state and vice versa;
   a connection to an external power source, the connection being connected to the electric actuator;
   a secondary power supply circuit connected to the connection and comprising a capacitor unit to store reserve capacity;
   a test circuit to test the capacitor unit, the test circuit being arranged to couple a test load on the capacitor unit in order to test its condition, and to conduct a single test including three measurements, the measurements including:
      measuring the voltage of the capacitor unit before connecting the test load;
      measuring a second time after connecting the test load; and
      measuring a third time before disconnecting the test load and after the second time; and
   a control unit arranged to control the test circuit, to calculate the equivalent serial resistance (ESR) value and the capacitance value of the capacitor unit on the basis of voltage measurements by the test circuit, and to determine a condition of the capacitor unit on a basis of the voltage measurements.

2. The electronic lock assembly according to claim 1, wherein the control unit is arranged to apply a predetermined testing period for the test circuit.

3. An electronic lock assembly comprising:
   a latch;
   a dead lock mechanism of the latch;
   an electric actuator to unlock and to lock the electronic lock assembly, the dead lock mechanism being connected to the latch, and the electric actuator being connected to the dead lock mechanism to drive it from the locked state to the unlocked state and vice versa;

a connection to an external power source, the connection being connected to the electric actuator;

a secondary power supply circuit connected to the connection and comprising a capacitor unit to store reserve capacity;

a test circuit to test the capacitor unit, the test circuit being arranged to couple a test load on the capacitor unit in order to test its condition, and to measure the voltage of the capacitor unit before connecting the test load, a second time after connecting the test load, and a third time before disconnecting the test load and after the second time; and a control unit arranged to control the test circuit, to calculate the equivalent serial resistance (ESR) value and the capacitance value of the capacitor unit on the basis of voltage measurements by the test circuit, and to determine a condition of the capacitor unit on a basis of the voltage measurements, wherein the limit values comprise ESR limit values and capacitance limit values for different temperatures, the control unit is arranged to compare a measured ESR value and a measured capacitance value to the respective ESR limit value and the capacitance limit value and, in response to the comparison, to determine the condition of the capacitor unit.

4. The electronic lock assembly according to claim 3, further comprising a limit value table comprising ESR and capacitance limit values.

5. The electronic lock assembly according to claim 3, further comprising a temperature sensor to measure a temperature, the temperature sensor being connected to the control unit, and the control unit being arranged to interpolate the ESR limit value and the capacitance limit value for the measured temperature by using limit values if the measured temperature is not included in the limit values.

6. The electronic lock assembly according to claim 5, wherein the control unit is arranged to apply several measurements in order to determine a change in the condition of the capacitor unit from a functional capacitor unit to a defective capacitor unit.

7. The electronic lock assembly according to claim 2, wherein the control unit is arranged to control the test circuit at given intervals, to test the condition of the capacitor unit.

8. The electronic lock assembly according to claim 7, wherein the test circuit is dimensioned so that a sufficient reserve capacity is left in the capacitor unit after disconnecting the test load.

9. The electronic lock assembly according to claim 8, wherein the control unit is arranged to stop the testing of the capacitor unit if a fault is detected in the connection to the external power source during the testing period.

10. The electronic lock assembly according to claim 1, further comprising an audio signal device, a light signal device, or a data transmission unit connected to the control unit and arranged to inform the user of the electronic lock assembly about the condition of the capacitor unit, if the capacitor unit is defective.

11. The electronic lock assembly according to claim 2, wherein the predetermined testing period is 0.8 to 10 seconds.

12. The electronic lock assembly according to claim 11, wherein the measurements of the voltage of the capacitor unit before connecting the test load, a second time slightly after connecting the test load, and a third time slightly before disconnecting the test load, are arranged to be taken at predetermined measurement intervals T1P, T2P, T3P so that several voltage measurements are taken during each measurement interval, from which the control unit is arranged to calculate an average voltage to be used as the measurement value for each measurement interval T1P, T2P, T3P.

13. The electronic lock assembly according to claim 2, wherein said second measurement after connecting the test load is arranged to be taken within 5 to 400 ms after connecting the test load, and said third measurement before disconnecting the test load is arranged to be taken within 5 to 300 ms before disconnecting the test load.

14. The electronic lock assembly according to claim 2, wherein the capacitor unit comprises at least one capacitor.

15. The electronic lock assembly according to claim 14, wherein the electric actuator is a solenoid or an electric motor.

16. The electronic lock assembly according to claim 2, wherein the electronic lock assembly is arranged to comprise a handle state, in which the locked state is controllable by the handle to an unlocked state, and the electric actuator or a second electric actuator is arranged to drive the electronic lock assembly on or off the handle state.

17. The electronic lock assembly according to claim 1, further comprising a lock body accommodating the latch the dead lock mechanism, the electric actuator the connection, the test circuit and the control unit.

18. The electronic lock assembly according to claim 1, further comprising:

a lock body; and a separate control module, in which the control unit and the capacitor unit are accommodated, the control unit and the capacitor unit being electrically connectable to the lock body, to the components accommodated in the lock body and using the control unit and the capacitor unit.

19. The electronic lock assembly according to claim 1, further comprising:

a lock body; and a separate control module, in which the control unit is accommodated, the control unit being electrically connectable to the lock body, to the components accommodated in the lock body and using the control unit.

\* \* \* \* \*